(12) United States Patent
Ootani et al.

(10) Patent No.: US 9,534,804 B2
(45) Date of Patent: Jan. 3, 2017

(54) AIR CONDITIONING SYSTEM AND AIR CONDITIONING CONTROL METHOD FOR SERVER ROOM

(75) Inventors: Hideyoshi Ootani, Chiba-ken (JP); Tomoyuki Kinoshita, Kanagawa-ken (JP); Yuuichi Hanada, Saitama-ken (JP); Yasuo Takagi, Kanagawa-ken (JP); Dai Murayama, Tokyo (JP); Kobun Takahashi, Tokyo (JP); Hiroshi Morimoto, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1225 days.

(21) Appl. No.: 13/536,167

(22) Filed: Jun. 28, 2012

(65) Prior Publication Data
US 2013/0005235 A1  Jan. 3, 2013

(30) Foreign Application Priority Data
Jun. 30, 2011  (JP) ............... P2011-145729

(51) Int. Cl.
H05K 7/20 (2006.01)
F24F 11/00 (2006.01)

(52) U.S. Cl.
CPC ....... *F24F 11/0001* (2013.01); *H05K 7/20745* (2013.01); *H05K 7/20836* (2013.01); *F24F 2011/0002* (2013.01); *F24F 2011/0006* (2013.01); *F24F 2011/0013* (2013.01); *F24F 2011/0016* (2013.01)

(58) Field of Classification Search
CPC ......... G06F 1/20; H05K 7/20; H05K 7/20709; H05K 7/20745; H05K 7/20836; F24F 11/0012; F24F 11/0015; F24F 2011/0002; F24F 2011/0013; F24F 2011/0016

USPC ....... 62/259.2; 361/688, 699, 690, 691, 694, 361/695, 696, 697
See application file for complete search history.

(56) References Cited

U.S. PATENT DOCUMENTS

| | | | | |
|---|---|---|---|---|
| 3,979,922 A | * | 9/1976 | Shavit | F24F 3/0525 165/251 |
| 6,079,483 A | * | 6/2000 | Morooka | G05D 27/02 165/11.1 |
| 8,141,374 B2 | | 3/2012 | Hay | |
| 8,578,726 B2 | | 11/2013 | Hay | |
| 8,584,477 B2 | | 11/2013 | Hay | |

(Continued)

FOREIGN PATENT DOCUMENTS

| DE | WO 2006039962 A1 * | 4/2006 | ......... H05K 7/20754 |
|---|---|---|---|
| JP | 2005-172309 | 6/2005 | |

(Continued)

OTHER PUBLICATIONS

Notice of Reasons for Refusal issued by the Japanese Patent Office on Aug. 28, 2014, in Japanese Patent Application No. 2011-145729, and English-language translation thereof.

(Continued)

*Primary Examiner* — Jonathan Bradford
(74) *Attorney, Agent, or Firm* — Finnegan, Henderson, Farabow, Garrett & Dunner LLP (57) ABSTRACT

According to the embodiment, the air conditioning system for a server changes air conditioning control target values within a certain range when outside air and return air both have higher specific enthalpy than the target state and hence the mixed air of the outside air and the return air cannot be adjusted to air in the target state.

2 Claims, 5 Drawing Sheets

(56) References Cited

U.S. PATENT DOCUMENTS

| | | | |
|---|---|---|---|
| 2008/0185446 A1 | 8/2008 | Tozer | |
| 2010/0154448 A1* | 6/2010 | Hay | G06F 1/20 62/175 |
| 2011/0172831 A1* | 7/2011 | Kreft | F24F 3/044 700/278 |
| 2012/0144850 A1 | 6/2012 | Hay | |
| 2012/0144851 A1 | 6/2012 | Hay | |
| 2013/0013117 A1* | 1/2013 | Desrochers | F24F 7/08 700/276 |
| 2014/0063730 A1 | 3/2014 | Hay | |

FOREIGN PATENT DOCUMENTS

| | | |
|---|---|---|
| JP | 2007-232331 | 9/2007 |
| JP | 2010-261696 | 11/2010 |
| JP | 2011-47581 | 3/2011 |
| JP | 2011-242010 | 12/2011 |

OTHER PUBLICATIONS

Invitation to Respond to Written Opinion, Written Opinion, and Search Report issued by the Intellectual Property Office of Singapore on Aug. 12, 2014.

* cited by examiner

AIR CONDITIONING SYSTEM AND AIR CONDITIONING CONTROL METHOD FOR SERVER ROOM

CROSS-REFERENCE TO RELATED APPLICATION(S)

This application is based upon and claims the benefit of priority from the prior Japanese Patent Application No. 2011-145729, filed on Jun. 30, 2011, the entire contents of which are incorporated herein by reference.

FIELD

Embodiment of the invention relates to an air conditioning system and an air conditioning control method for a server room.

BACKGROUND

Generally, there is a large amount of heat generated in a data center since many servers are placed in the data center. Normal operation of the servers requires that air conditioning be properly controlled to keep environmental conditions for a server room in a predetermined range.

Technology for cooling air in a room in which many computers are installed as in the data center has been known from JP, P2005-172309A. JP, P2005-172309A discloses an air conditioning system configured such that air sucked in from a space in the lower portion of the room is blown out from a space in the upper portion of the room and thereby the air is sucked into upper portions of server racks.

This technology enables efficient air conditioning control by reducing temperature gradients throughout the entire area in the room and also reducing variations in supply air temperature.

The data center in which load on an object to be air conditioned is information equipment has different features from those of typical buildings. For example, the features are that:

most of the load is sensible heat load;
 the set temperature and humidity fall within a certain range; and
 ventilation for preventing an increase in $CO_2$ concentration is unnecessary since the load does not generate $CO_2$.

However, the conventional data center wastes energy because of not performing air conditioning control adapted for these features.

An object of the present invention is to provide an air conditioning system and an air conditioning control method for a server room, capable of performing air conditioning control having a great energy-saving effect with efficiency and reliability.

DETAILED DESCRIPTION

An air conditioning system for a server room, according to the embodiment, includes:

means for adjusting the amount of admission of return air flowing out of the server room as an object to be subject to air conditioning control;
 means for adjusting the amount of admission of outside air;
 an air conditioning control setting unit configured to make air conditioning control settings for generating supply air in a state which lies within a target state and falls under a preset first specific enthalpy in order to generate the supply air in the target state from at least any one of the admitted return air and outside air, the target state being a state falling within a preset target range of supply air temperature, within a preset target range of supply air absolute humidity, and within a preset target range of supply air relative humidity; and configured to make air conditioning control settings for generating supply air in a state which lies within the target state and falls under a second specific enthalpy higher than the first specific enthalpy, when absolute humidity of the outside air is equal to or lower than an upper limit value of the target range of supply air absolute humidity, relative humidity of the outside air is higher than an upper limit value of the target range of supply air relative humidity, specific enthalpy of the outside air is equal to or higher than the first specific enthalpy, and specific enthalpy of the return air is equal to or higher than the first specific enthalpy, or when relative humidity of supply air obtained by mixing together the outside air and the return air is higher than the upper limit value of the target range of supply air relative humidity; and
 an equipment controller configured to generate control signals for controlling the amount of admission of the outside air and the amount of admission of the return air, based on the air conditioning control settings made by the air conditioning control setting unit, thereby to control the means for adjusting the amount of admission of the return air and the means for adjusting the amount of admission of the outside air.

(Configuration of Air Conditioning System for Server Room)

Figure 1:
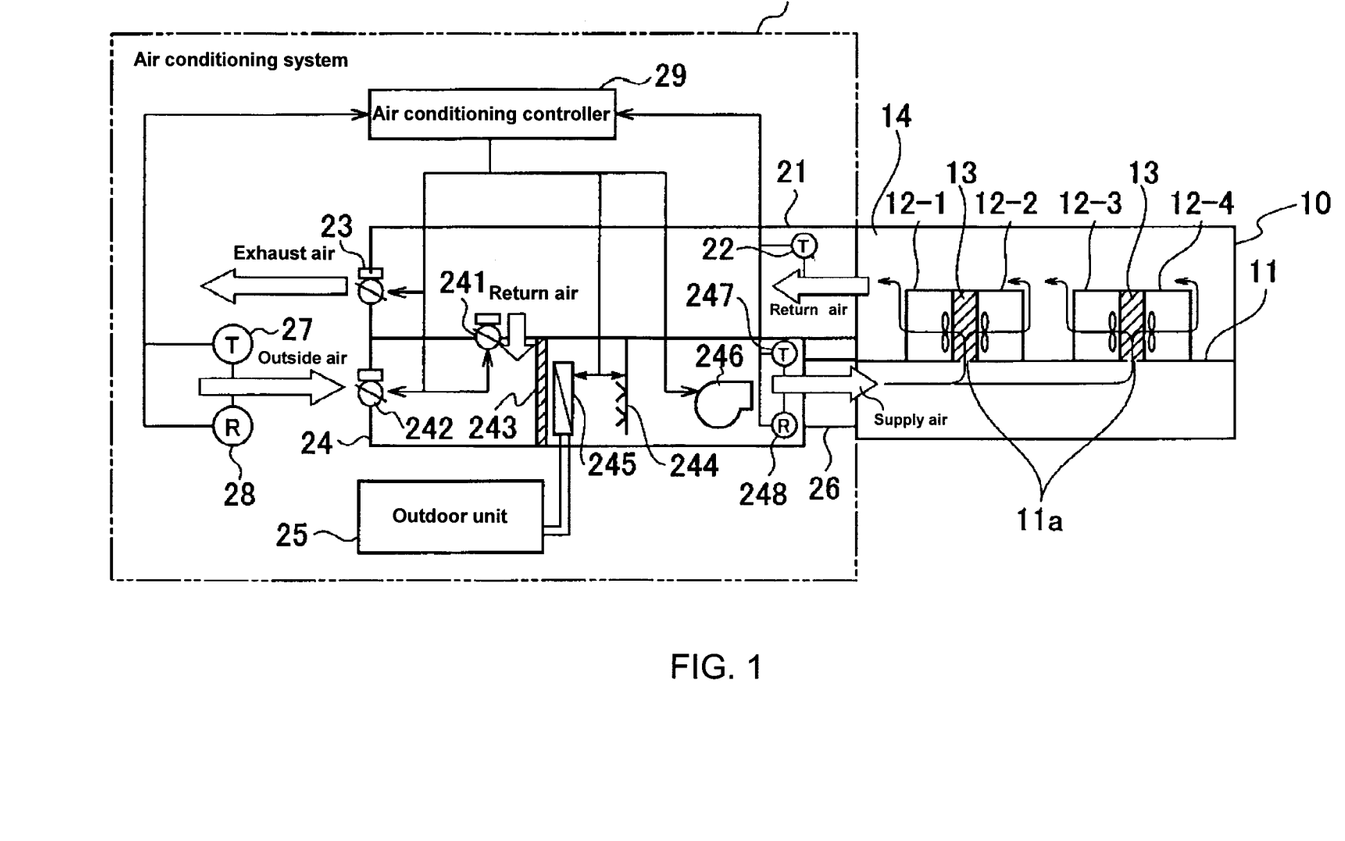
FIG. 1 is a general drawing showing a configuration of an air conditioning system according to one embodiment.

A configuration of an air conditioning system for a server room according to one embodiment will be described with reference to FIG. 1.

An air conditioning system 20 controls air conditioning in a server room 10 in a data center or the like.

Firstly, the server room 10 will be described. The server room 10 is provided with a double floor 11 having plural openings 11a, and plural server racks 12-1 to 12-4 are placed on the double floor 11. Each of the plural server racks 12-1 to 12-4 contains plural servers (unillustrated). Fans in the servers or fans installed in the server racks 12-1 to 12-4 produce an air flow shown by arrows of FIG. 1 in the server room 10. Specifically, cold air flowing into a lower portion of the double floor 11 is sucked into an upper portion of the double floor 11 through the openings 11a of the double floor 11, and the cold air is heated by heat of the servers. Then, the heated air, or hot air, flows out as return air to the air conditioning system 20. Such an air flow forms a cold area 13 containing the cold air sucked into the server racks 12-1 to 12-4 and a hot area 14 containing the hot air blown out of the server racks 12-1 to 12-4, in the upper portion of the double floor 11. Then, the servers are cooled by the cold air thereby to operate normally.

Next, the air conditioning system 20 will be described. The air conditioning system 20 includes a return air duct 21, a return air temperature sensor 22, an exhaust damper 23, an indoor unit 24, an outdoor unit 25, an air supply duct 26, an outside air temperature sensor 27, an outside air humidity sensor 28, and an air conditioning controller 29.

The return air duct 21 is a pipe for passage of air therethrough, and provides a connection between the hot area 14 of the server room 10 and the indoor unit 24 of the air conditioning system 20.

The return air temperature sensor 22 measures the temperature of the return air flowing in from the hot area 14, and transmits the measured value to the air conditioning controller 29.

The exhaust damper 23 adjusts the amount of return air discharged to the outside through the return air duct 21, by its opening.

The indoor unit 24 includes a return air inlet damper 241, an outside air inlet damper 242, a filter 243, a humidifier 244, a cooling coil 245, an air supply fan 246, a supply air temperature sensor 247, and a supply air humidity sensor 248.

The return air inlet damper 241 adjusts the amount of return air led into the indoor unit 24 through the return air duct 21, by its opening. The return air inlet damper 241 is means for adjusting the amount of return air admission.

The outside air inlet damper 242 adjusts the amount of outside air led into the indoor unit 24, by its opening. The outside air inlet damper 242 is means for adjusting the amount of outside air admission.

The filter 243 removes dust from the outside air and return air led into the indoor unit 24.

The humidifier 244 humidifies the outside air and return air passed through the filter 243, as needed.

The cooling coil 245 generates cold air by cooling the outside air and return air passed through the filter 243, as needed.

The air supply fan 246 feeds supply air to the cold area 13. Specifically, the outside air and return air humidified as needed and optionally also cooled as needed pass through the air supply duct 26, under the floor of the server room 10, and into the cold area 13.

The supply air temperature sensor 247 measures the temperature of the supply air flowing into the server room 10, and transmits the measured value to the air conditioning controller 29.

The supply air humidity sensor 248 measures the humidity of the supply air flowing into the server room 10, and transmits the measured value to the air conditioning controller 29.

The outdoor unit 25 is connected to the cooling coil 245. For the cooling coil 245 to generate the cold air, the outdoor unit 25 supplies a refrigerant to the cooling coil 245. The cooling coil 245 and the outdoor unit 25 form a cold air generator.

The air supply duct 26 is a pipe for passage of air therethrough, and provides a connection between the indoor unit 24 and a portion of the server room 10 under the floor thereof, leading to the cold area 13 thereof.

The outside air temperature sensor 27 measures the outside air temperature, and transmits the measured value to the air conditioning controller 29. The outside air humidity sensor 28 measures the outside air humidity, and transmits the measured value to the air conditioning controller 29.

Figure 2:
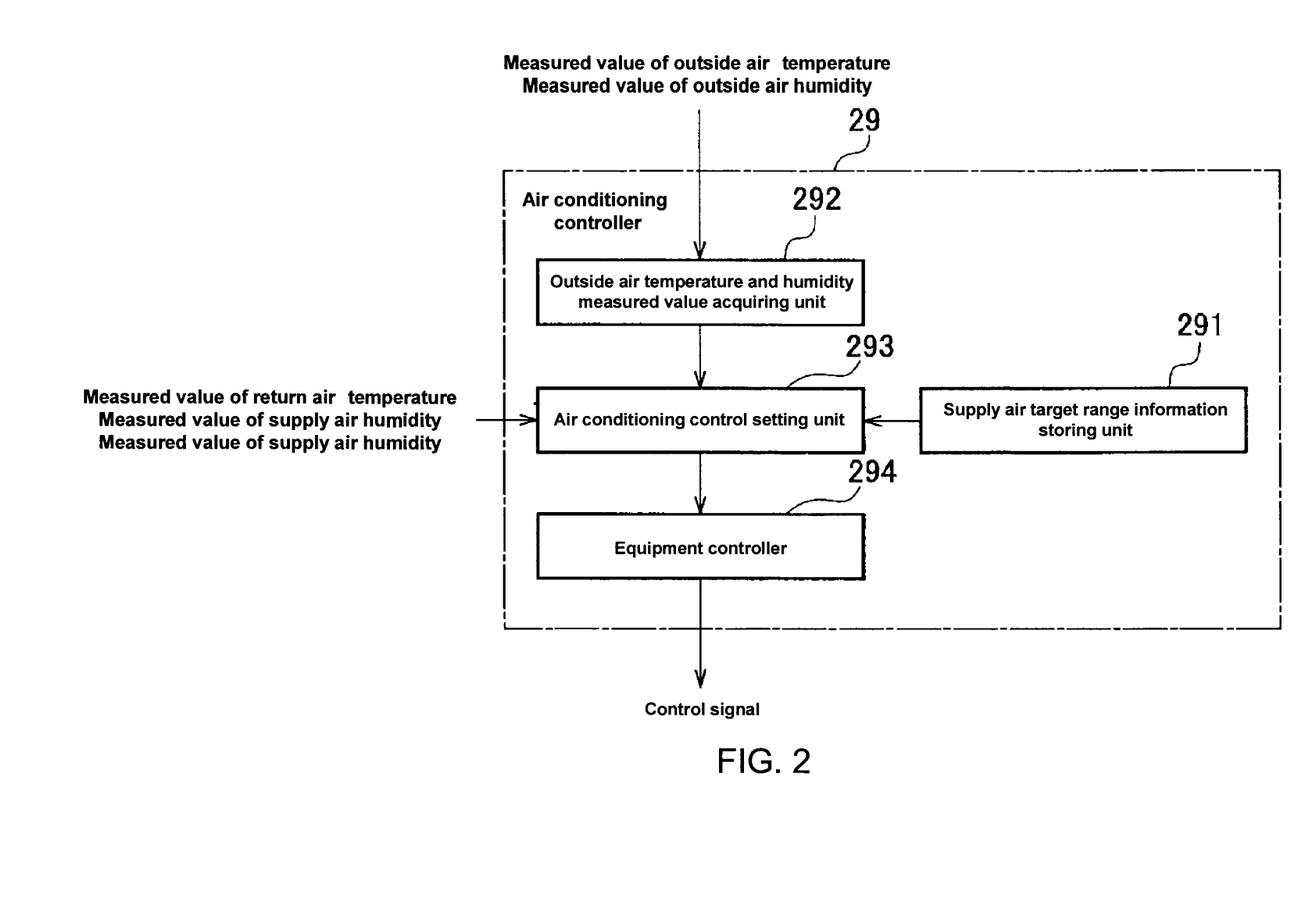
FIG. 2 is a block diagram showing a configuration of an air conditioning controller of the air conditioning system according to one embodiment.

The air conditioning controller 29 controls the overall air conditioning system. As shown in FIG. 2, the air conditioning controller 29 includes a supply air target range information storing unit 291, an outside air temperature and humidity measured values acquiring unit 292, an air conditioning control setting unit 293, and an equipment controller 294.

The supply air target range information storing unit 291 stores a target range of supply air temperature and a target range of supply air humidity for the supply air fed to the server room 10.

The outside air temperature and humidity measured values acquiring unit 292 acquires the measured value of the outside air temperature obtained by the outside air temperature sensor 27, and the measured value of the outside air humidity obtained by the outside air humidity sensor 28.

The air conditioning control setting unit 293 receives the target range of supply air temperature and the target range of supply air humidity stored in the supply air target range information storing unit 291, the measured value of the outside air temperature and the measured value of the outside air humidity acquired by the outside air temperature and humidity measured values acquiring unit 292, the measured value of the return air temperature obtained by the return air temperature sensor 22, the measured value of the supply air temperature obtained by the supply air temperature sensor 247, and the measured value of the supply air humidity obtained by the supply air humidity sensor 248. The air conditioning control setting unit 293 makes air conditioning control settings for generating supply air which falls within both a preset target range of supply air temperature and a preset target range of supply air humidity, based on the received data.

The equipment controller 294 controls operation of each individual piece of equipment in the air conditioning system 20, based on the air conditioning control settings made by the air conditioning control setting unit 293.

(Operation of Air Conditioning System for Server Room)

Next, operation of the air conditioning system 20 for the server room according to the embodiment will be described.

In the embodiment, the supply air target range information storing unit 291, included in the air conditioning controller 29 of the air conditioning system 20 for the server room, stores in advance the target range of supply air temperature and the target range of supply air humidity for the supply air supplied to the server room 10.

In the embodiment, it is assumed that the supply air target range information storing unit 291 stores range information given below, as the target range of supply air temperature and the target range of supply air humidity as target conditions for the supply air supplied to the server room 10, according to standards specified in ASHRAE (American Society of Heating, Refrigerating and Air-Conditioning Engineers). Temperatures: 18° C. to 27° C.; Absolute humidity: 0.0056 to 0.0107 kg/kg; and Relative humidity: 60% or lower. Incidentally, hereinafter, a target range of absolute humidity will be referred to as a target range of supply air absolute humidity, and a target range of relative humidity will be referred to as a target range of supply air relative humidity. Also, the target range of supply air absolute humidity and the target range of supply air relative humidity will be collectively called a target range of supply air humidity.

As described above, the supply air target range information storing unit 291 stores the target range of supply air temperature and the target range of supply air humidity. Under this condition, operation of the air conditioning controller 29 will be described.

First, the air conditioning control setting unit 293 acquires the measured value of the outside air temperature and the measured value of the outside air humidity acquired by the outside air temperature and humidity measured values acquiring unit 292.

Then, the air conditioning control setting unit 293 acquires the target range of supply air temperature and the target range of supply air humidity stored in the supply air target range information storing unit 291. Detailed description will be given below with regard to a process for making air conditioning control settings for generation of supply air which falls within both the target range of supply air temperature and the target range of supply air humidity.

Figure 3:
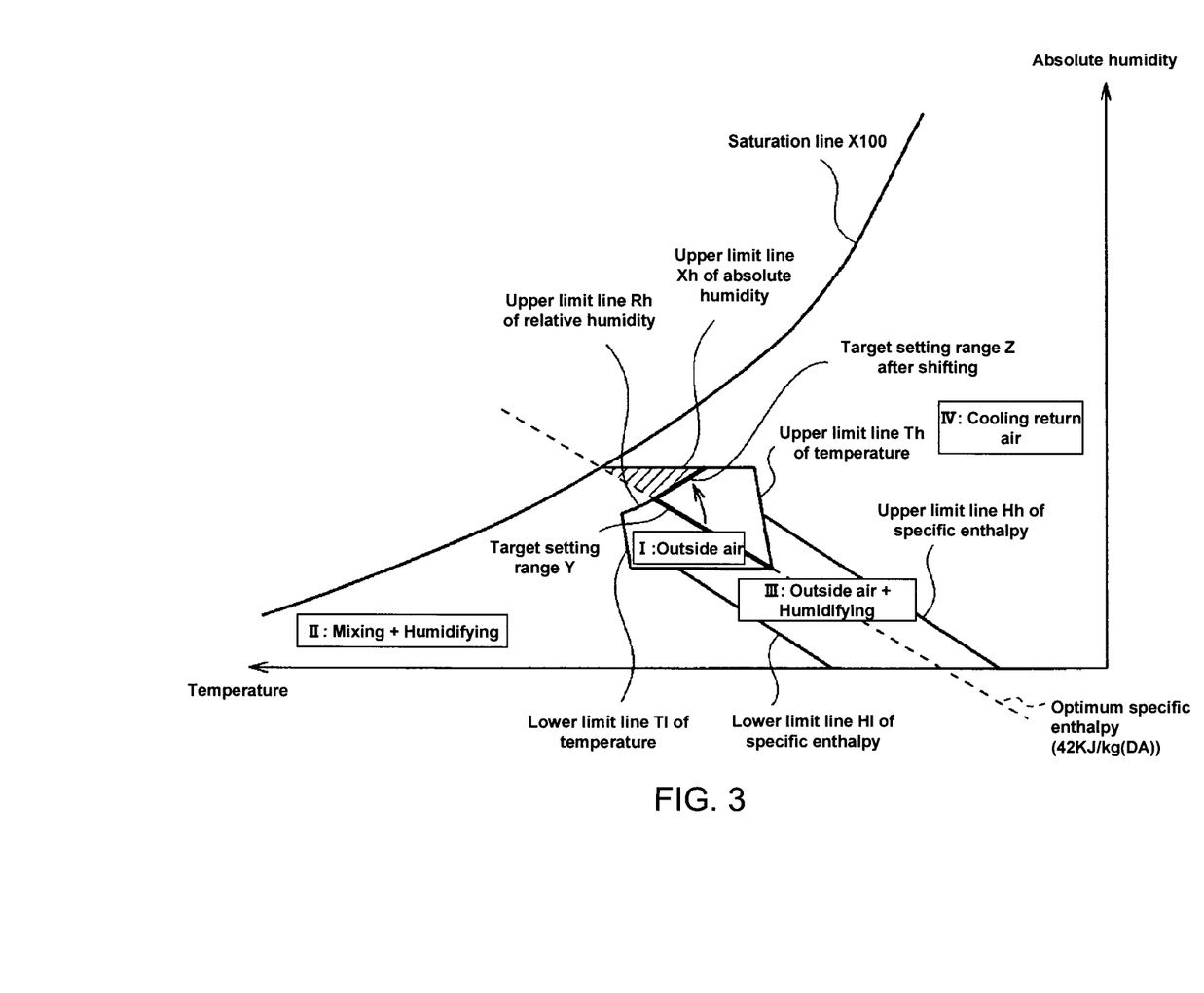
FIG. 3 is a psychrometric chart showing ranges into which the state of outside air is classified by the air conditioning controller of the air conditioning system according to one embodiment.

FIG. 3 shows a psychrometric chart. The state of air is divided into plural regions on the psychrometric chart in FIG. 3. First, the air conditioning control setting unit 293 determines a region on the psychrometric chart in FIG. 3, under which the present state of the outside air falls, based on the measured value of the outside air temperature and the measured value of the outside air humidity. The psychrometric chart is the plot from which the state of humid air can be seen, and the temperature, the absolute humidity, the relative humidity, specific enthalpy and others are plotted on the plot.

On the psychrometric chart in FIG. 3, the state of air in which the relative humidity is equal to or lower than 100% (or a saturated state) is divided into regions I to IV given below. Specifically, the state of air is divided into the regions I to IV, based on upper and lower limit values of the target range of supply air temperature, upper and lower limit values of the target range of supply air humidity, and upper and lower limit values of the specific enthalpy corresponding to the state of air in a range which falls both under the target range of supply air temperature and under the target range of supply air humidity. In the embodiment, it is assumed that the upper and lower limit values of the specific enthalpy corresponding to the state of air in the range which falls both under the target range of supply air temperature and under the target range of supply air humidity are 50 kJ/kg (DA) and 35 kJ/kg (DA), respectively. Also, it is assumed that an optimum value of the specific enthalpy is 42 kJ/kg (DA).

(Regarding Regions I to IV)

Region I (First Range of State of Air)

The region I is a range which satisfies all the following: the target range of supply air temperature, the target range of supply air absolute humidity, and the target range of supply air relative humidity. In other words, the region I is the range on the psychrometric chart, which satisfies Equation (1). Air in the region I is the air in a target state suitable for supply air for the server room 10.

$$\text{(Temperatures: 18° C. to 27° C. inclusive)} \cap \text{(Absolute humidity: 0.0056 to 0.0107 kg/kg (DA) inclusive)} \cap \text{(Relative humidity: 60% or lower)} \quad (1)$$

Region II (Second Range of State of Air)

The region II is a range formed by a combination of a range 1 and a range 2 given below.

Range 1: The range 1 is the range which is both below the lower limit value of the target range of supply air absolute humidity and below the lower limit value of the specific enthalpy corresponding to the state of air in the range which falls both under the target range of supply air temperature and under the target range of supply air humidity. In other words, the range 1 is the range on the psychrometric chart, which satisfies Equation (2).

$$\text{(Absolute humidity: Lower than 0.0056 kg/kg (DA))} \cap \text{(Specific enthalpy Lower than 35 kJ/kg (DA))} \quad (2)$$

Range 2: The range 2 is the range which satisfies both a range which lies within the target range of supply air absolute humidity, and a range which is less than the lower limit value of the target range of supply air temperature or is not less than the upper limit value of the target range of supply air relative humidity. In other words, the range 2 is the range on the psychrometric chart, which satisfies Equation (3).

$$\text{(Absolute humidity: 0.0056 to 0.0107 kg/kg (DA) inclusive)} \cap \{\text{(Temperatures: Lower than 18° C.)} \cup \text{(Relative humidity: 60% or higher)}\} \quad (3)$$

Region III (Third Range of State of Air)

The region III is a range which satisfies both a range which lies within a range of the specific enthalpy corresponding to the state of air in the range which falls both under the target range of supply air temperature and under the target range of supply air humidity, and a range which is below the lower limit value of the target range of supply air absolute humidity or is above the upper limit value of the target range of supply air temperature. In other words, the region III is the range on the psychrometric chart, which satisfies Equation (4).

$$\text{(Specific enthalpy: 35 to 50 kJ/kg (DA) inclusive)} \cap \{\text{(Absolute humidity: Lower than 0.0056 kg/kg (DA))} \cup \text{(Temperatures: Higher than 27° C.)}\} \quad (4)$$

Region IV (Fourth Range of State of Air)

The region IV is a range other than the regions I to III.

As described above, the air conditioning control setting unit 293 determines a region under which the present state of the outside air falls, from the regions I to IV. Then, the air conditioning control setting unit 293 makes air conditioning control settings given below, for each of the regions, using the measured value of the outside air temperature and the measured value of the outside air humidity acquired by the outside air temperature and humidity measured values acquiring unit 292, the measured value of the return air temperature obtained by the return air temperature sensor 22, the measured value of the supply air temperature obtained by the supply air temperature sensor 247, and the measured value of the supply air humidity obtained by the supply air humidity sensor 248. Here, it is assumed that an object to be subject to air conditioning control is sensible heat load caused by heat generated by the servers in the server room 10, and latent heat load caused by human exhalation or the like is not generated. Also, it is assumed that a return air humidity value is identical with the measured value of the supply air humidity obtained by the supply air humidity sensor 248. Next, description will be given with regard to air conditioning control settings which are made when the state of the outside air falls under each of the regions I to IV.

(Regarding Air Conditioning Control Settings)

Air Conditioning Control Settings which are Made when the Outside Air Falls Under the Region I When the present state of the outside air lies within the region I, the outside air is in the target state suitable for an environment in the server room 10. The outside air can be used as supply air, as it is. Thus, the air conditioning control setting unit 293 determines air conditioning control settings such that an outside air admission rate is 100%. Specifically, the exhaust damper 23 is fully open, the return air inlet damper 241 is closed, and the outside air inlet damper 242 is fully open. Also, at this time, the humidifier 244 does not perform a humidifying process, and the cooling coil 245 does not perform a cooling process. The outside air admission rate is represented as the amount of outside air admission/(the amount of outside air admission + the amount of return air admission) (%).

Air Conditioning Control Settings which are Made when the Outside Air Falls Under the Region II When the present state of the outside air lies within the region II, the air conditioning control setting unit 293 determines air conditioning control settings such that air in the target state (in the state of the region I) is generated by mixing the return air with the outside air to thereby increase the temperature of the outside air, and optionally also by humidifying the mixed air as needed. Specifically, the openings of the exhaust damper 23, the return air inlet damper 241 and the outside air inlet damper 242 are each adjusted between 0% and 100% according to the outside air admission rate. Also, the humidifier 244 performs humidifying as needed.

At this time, a target value a of the outside air admission rate is adjusted according to the measured value of the outside air temperature and the measured value of the return air temperature so that the temperature of the air after mixing reaches a preset target value of supply air temperature within the target range of supply air temperature.

An absolute humidity value X of the mixed air of the outside air and the return air is expressed by Equation (5), using a measured value Xo of outside air absolute humidity, a measured value Xr of return air absolute humidity, and the target value a of the outside air admission rate.

$$X = Xo \times \alpha + Xr \times (1-\alpha) \quad (5)$$

When the absolute humidity value X of the mixed air is equal to or less than the lower limit value of the target range of supply air absolute humidity, the mixed air needs to be humidified by Xs0-X as a difference from a target value Xs0 of supply air absolute humidity. The amount of humidification necessary to increase the humidity value by the difference is $Fs \times (Xs0-X)$ when expressed using a supply air flow rate Fs. Control settings for a valve (unillustrated) for controlling the amount of water in the humidifier 244 are determined so as to supply the necessary amount of humidification. At this time, the cooling coil 245 does not cool the mixed air.

Incidentally, the amount of humidification necessary to humidify the mixed air of the outside air and the return air is determined as described above; however, the return air may also be humidified in advance to eliminate the need for humidification after the mixing. In this case, the absolute humidity value of the return air is preset to $\{Xr+(X-Xs0)/(1-\alpha)\}$.

In this case, the target value α of the outside air admission rate is expressed by Equation (6)

$$\alpha = (Tr2-Ts0)/(Tr2-T0) \times 100 (\%) \quad (6)$$

where To denotes the measured value of the outside air temperature; Tr2, the return air temperature value after the humidification; and Ts0, the target value of the supply air temperature.

Air Conditioning Control Settings which are Made when the Outside Air Falls Under the Region III When the present state of the outside air lies within the region III, the air conditioning control setting unit 293 determines air conditioning control settings such that the outside air is humidified thereby to generate air in the target state (in the state of the region I). Specifically, the exhaust damper 23 is fully open, the return air inlet damper 241 is closed, and the outside air inlet damper 242 is fully open. The outside air admission rate is 100%, and also, the humidifier 244 performs humidification in a necessary amount.

In this case, the necessary amount of humidification is Xs0-Xo when expressed using the measured value Xo of the outside air absolute humidity and the target value Xs0 of the supply air absolute humidity. At this time, the humidification causes a decrease in the outside air temperature from To to T. When the target value Ts0 of the supply air temperature is lower than T, the cooling coil 245 is controlled so as to perform the cooling process so that the temperature of the outside air reaches the target value of the supply air temperature.

Air Conditioning Control Settings which are Made when the Outside Air Falls Under the Region IV When the present state of the outside air lies within the region IV, the air conditioning control setting unit 293 determines air conditioning control settings such that the return air is cooled thereby to generate air in the target state (in the state of the region I). Specifically, the exhaust damper 23 is closed, the return air inlet damper 241 is fully open, and the outside air inlet damper 242 is closed. The outside air admission rate is 0%, and also, the cooling coil 245 performs cooling and dehumidification. At this time, the humidifier 244 does not perform the humidifying process.

Incidentally, even when the present state of the outside air lies within the region IV, a lower limit value of the outside air admission rate may be preset so as to take in a certain amount of outside air, if there is a demand for ventilation for an operator in the server room 10.

In each of the above-described cases, the air conditioning control setting unit 293 makes different air conditioning control settings. The air conditioning control settings include control command values for individual pieces of equipment. For example, the control command values include the opening of the exhaust damper 23, the opening of the return air inlet damper 241, the opening of the outside air inlet damper 242, controlled variables for the humidifier 244, controlled variables for the cooling coil 245, and revolution speed of the air supply fan 246. The equipment controller 294 generates control signals for controlling the opening of the exhaust damper 23, the opening of the return air inlet damper 241, the opening of the outside air inlet damper 242, the controlled variables for the humidifier 244, the controlled variables for the cooling coil 245, and the revolution speed of the air supply fan 246, based on the air conditioning control settings, and transmits the control signals to the individual pieces of equipment. The individual pieces of equipment are controlled based on the control signals, thereby to generate supply air having a supply air temperature value and a supply air humidity value which fall within their respective target ranges.

(Regarding Setting of Air Conditioning Control Target Values)

Next, description will be given with regard to air conditioning control target values, namely, a target value of supply air temperature and a target value of supply air humidity. The target value of supply air temperature is a specific value within the target range of supply air temperature, and the target value of supply air humidity is a specific value within the target range of supply air humidity. When the outside air falls under any one of the regions II to IV, each individual piece of equipment is controlled aiming for the air conditioning control target values. Description will be given with regard to setting of the air conditioning control target values. For the setting of the air conditioning control target values, a target setting range Y is set on a line, in the region I, indicating a first specific enthalpy as the optimum specific enthalpy (e.g. a specific enthalpy of 42 kJ/kg (DA)). A temperature value and an absolute humidity value which fall under any position within the target setting range Y are set as the target value Ts0 of the supply air temperature and the target value Xs0 of the supply air absolute humidity, respectively.

Incidentally, when the outside air satisfies specific conditions to be described later, the air conditioning control target values are switched from one mode to another. Specifically, the target value Ts0 of the supply air temperature and the target value Xs0 of the supply air absolute humidity are shifted to values within a target setting range Z which lies within the region I and falls under a second specific enthalpy higher than the first specific enthalpy. The target setting range Z is located on a line indicating a relative humidity of 60%, for example.

At this time, for example, a point of intersection of a line connecting a position indicating the state of the outside air and a position indicating the state of the return air, and a line indicating a relative humidity of 60% as the upper limit value of the target range of supply air relative humidity in the region I, on the psychrometric chart in FIG. 3, is set as the target value Ts0 of the supply air temperature and the target value Xs0 of the supply air absolute humidity.

(Flowchart of Switching Operation for Air Conditioning Control Target Values)

Figure 4:
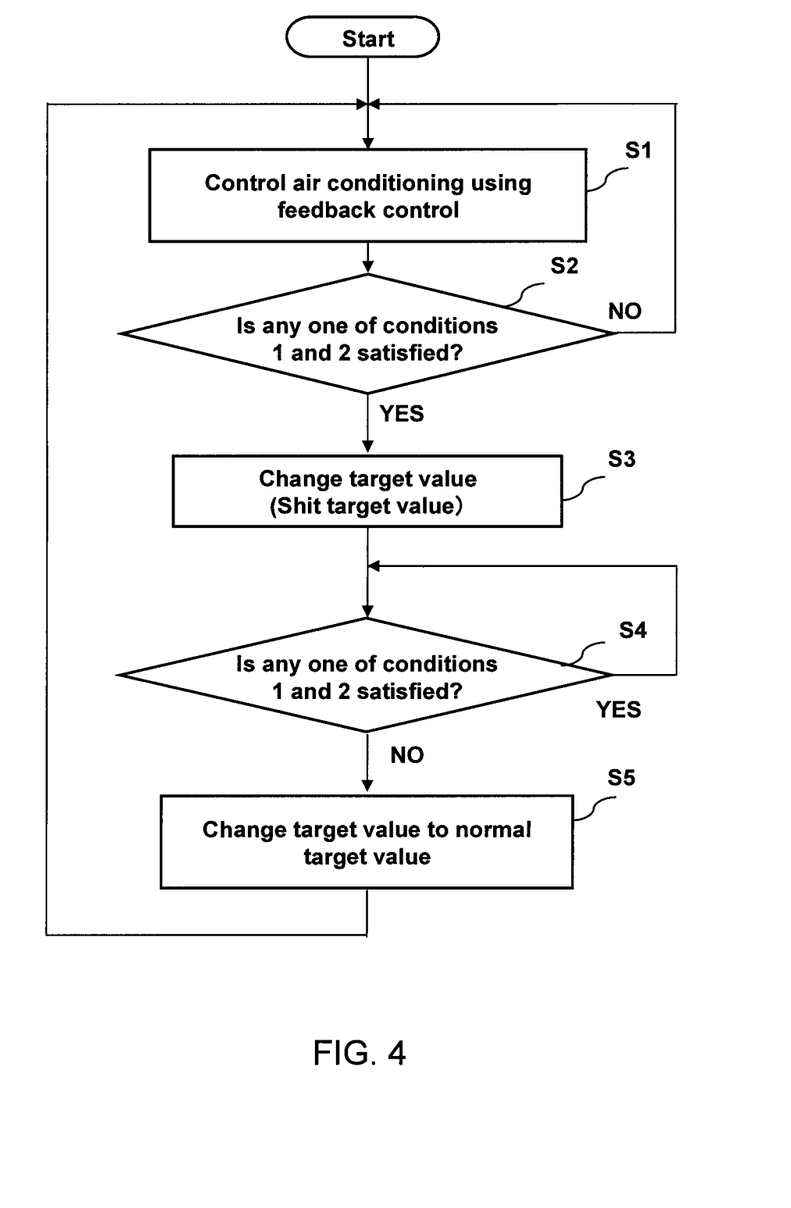
FIG. 4 is a flowchart showing operation of the air conditioning controller of the air conditioning system according to one embodiment.

When the state of the outside air lies within the region II, a process for setting the air conditioning control target values is executed as shown in a flowchart of FIG. 4.

When the present state of the outside air lies within the region II, first, a temperature value and an absolute humidity value within the target setting range Y are set as the target value Ts0 of the supply air temperature and the target value Xs0 of the supply air absolute humidity, respectively. Then, the outside air and the return air are mixed together at a ratio such that air is generated in any state within the target setting range Y which is on the dotted line indicating the first specific enthalpy (42 kJ/kg (DA)). After that, the mixed air is humidified and is cooled by evaporation, as needed. Thereby, the mixed air is adjusted to air in a state which falls under the target value Ts0 of the supply air temperature and the target value Xs0 of the supply air absolute humidity within the target setting range Y.

Under normal conditions, a series of control operations described above is efficiently executed by feedback control so as to eliminate a difference between the temperature value of the air after adjustment and the target value Ts0 of the supply air temperature, and a difference between the absolute humidity value of the air after the adjustment and the target value Xs0 of the supply air absolute humidity (at step S1).

However, when any one of conditions 1 and 2 given below is satisfied in the region II, even the mixed air of the outside air and the return air cannot be adjusted to air having a specific enthalpy of 42 kJ/kg (DA) as the optimum specific enthalpy in the region I.

Condition 1: The state of the outside air lies within a range which satisfies Equation (7), and the specific enthalpy of the return air is equal to or higher than the first specific enthalpy. The range which satisfies Equation (7) is a cross-hatched area on the psychrometric chart in FIG. 3. Specifically, the range which satisfies Equation (7) is the range in which the absolute humidity is equal to or lower than the upper limit value of the target range of supply air absolute humidity, the relative humidity is higher than the upper limit value of the target range of supply air relative humidity, and the specific enthalpy is equal to or higher than the first specific enthalpy.

$$(\text{Absolute humidity: 0.0107 kg/kg (DA) or lower}) \cap \\ (\text{Relative humidity: 60\% or higher}) \cap (\text{Specific} \\ \text{enthalpy: 42 kJ/kg (DA) or higher}) \quad (7)$$

Condition 2: The relative humidity of supply air obtained by mixing together the outside air and the return air is higher than 60% as the upper limit value of the target range of supply air relative humidity.

When the condition 1 is satisfied, even the mixed air of the outside air and the return air cannot be adjusted to air having a specific enthalpy of 42 kJ/kg (DA). Therefore, the air conditioning controller 29 stays in a state in which the outside air alone is taken in.

Also, when the condition 2 is satisfied, the supply air obtained by mixing together the outside air and the return air falls outside a range of constraints of supply air conditions. Therefore, the air conditioning controller 29 stays in the state in which the outside air alone is taken in.

When any one of the conditions 1 and 2 is satisfied, the air conditioning controller 29 stays in the state in which the outside air alone is taken in. Therefore, the air conditioning system 20 cannot bring air in the server room 10 into the state suitable for the server room 10 (the state of the region I).

Therefore, when any one of the conditions 1 and 2 is satisfied ("YES" at step S2), the air conditioning control setting unit 293 performs switching for the target values (at step S3). Specifically, the air conditioning control setting unit 293 shifts the target value Ts0 of the supply air temperature and the target value Xs0 of the supply air absolute humidity to values within the target setting range Z which lies within the region I and falls under the second specific enthalpy higher than the first specific enthalpy.

Thereby, the outside air and the return air are mixed together at a ratio such that the temperature and absolute humidity of the air after the mixing reach the target value Ts0 of the supply air temperature and the target value Xs0 of the supply air absolute humidity, respectively, after shift, so that the mixed air is adjusted to air in a desirable state in the region I.

At this time, for example, the point of intersection of the line connecting the position indicating the state of the outside air and the position indicating the state of the return air, and the line indicating a relative humidity of 60% as the upper limit value of the target range of supply air relative humidity in the region I, on the psychrometric chart in FIG. 3, is set as the target value Ts0 of the supply air temperature and the target value Xs0 of the supply air absolute humidity. This enables air conditioning control with efficiency at low energy.

After that, when the conditions 1 and 2 are not satisfied ("NO" at step S4), the air conditioning control setting unit 293 performs switching again to shift the air conditioning control target values to normal target values (at step S5). Then, the process returns to step S1, and the air conditioning control continues.

(Regarding Air Conditioning Control Setting Unit)

Figure 5:
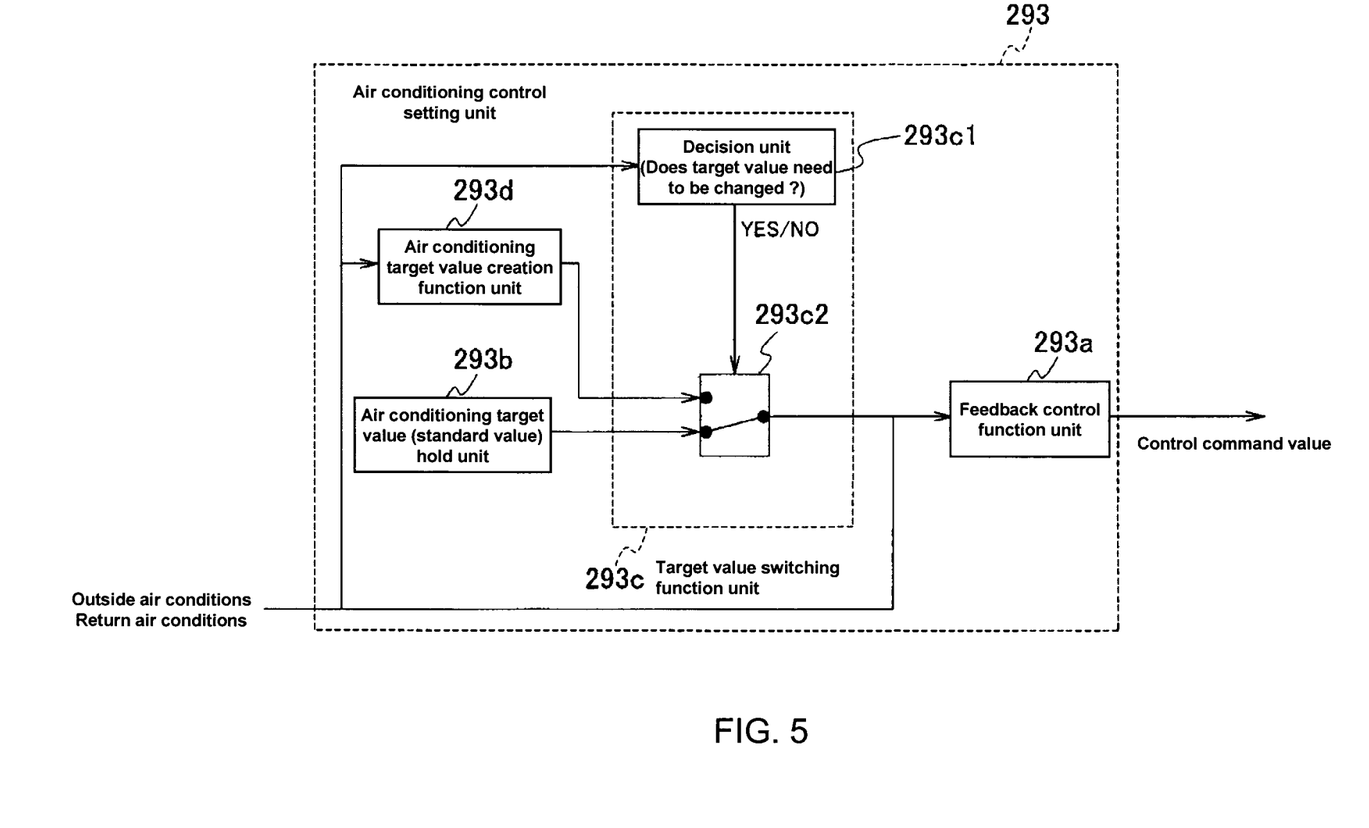
FIG. 5 is a block diagram showing a configuration of an air conditioning control setting unit of the air conditioning controller according to one embodiment.

Next, description will be given with regard to a configuration for switching of the air conditioning control target values. FIG. 5 shows an internal structure of the air conditioning control setting unit 293 of the air conditioning controller 29 for implementing the above-described air conditioning system.

A feedback control function unit 293*a* of the air conditioning control setting unit 293 receives outside air conditions and return air conditions as inputs, and outputs the control command values for the equipment. The outside air conditions are the measured value of the outside air temperature and the measured value of the outside air humidity. Also, the return air conditions are the measured value of the return air temperature and the measured value of the supply air humidity. Also, the air conditioning control setting unit 293 holds predetermined values (i.e. the air conditioning control target values) within the target setting range Y, as standard values, in an air conditioning target value (standard value) hold unit 293*b*.

At this time, when a decision unit 293*c*1 determines that the conditions 1 and 2 are not satisfied ("NO" at step S2 in FIG. 4), the decision unit 293*c*1 controls a selector switch 293*c*2 so that the air conditioning target value (standard value) hold unit 293*b* is connected to the feedback control function unit 293*a*. Therefore, the values retained in the air conditioning target value (standard value) hold unit 293*b* (i.e. the values within the target setting range Y, which fall under the first specific enthalpy) are used as the target values for the feedback control.

On the other hand, when the decision unit 293*c*1 determines that any one of the conditions 1 and 2 is satisfied ("YES" at step S2 in FIG. 4), it is necessary to change the target values. An air conditioning target value creation function unit 293*d* creates values within the target setting range Z, which fall under the second specific enthalpy, as the target values, based on the outside air conditions and the return air conditions. Also, the decision unit 293*c*1 controls the selector switch 293*c*2 so that the air conditioning target value creation function unit 293*d* is connected to the feedback control function unit 293*a*. Therefore, the values within the target setting range Z, which fall under the second specific enthalpy, are used as the target values for the feedback control, and the feedback control is performed according to the target values.

After that, when the conditions 1 and 2 are not satisfied ("NO" at step S4), a target value switching function unit 293*c* performs switching again to shift the air conditioning control target values to the normal target values (at step S5). In other words, the decision unit 293*c*1 controls the selector switch 293*c*2 so that the air conditioning target value (standard value) hold unit 293*b* is connected to the feedback control function unit 293*a*. Therefore, the values retained in the air conditioning target value (standard value) hold unit 293*b* are used as the target values for the feedback control. Then, the air conditioning control continues.

According to the embodiment described above, the air conditioning system performs control suitable for the server room with reliability, by selecting air conditioning control settings according to the state of the outside air, and also by increasing the length of time for cooling utilizing the outside air. Thereby, the air conditioning system can perform air conditioning control for the server room, having a great energy-saving effect.

In this case, when the outside air and the return air both have higher specific enthalpy than the target and hence the mixed air of the outside air and the return air cannot achieve the target specific enthalpy (cannot be adjusted to air in the target state), the air conditioning system can achieve the air in the target state by performing switching to select the air conditioning control target values within a certain range.

Thereby, the air conditioning system can reduce the length of time during which the supply air lies outside the target state, and thus can keep the server room in a desirable state.

Also, in the above-described embodiments, the values based on the standards specified in ASHRAE are used as the target range of supply air temperature and the target range of supply air humidity; however, the air conditioning system and the air conditioning control method of the present invention are not so limited but may use other values according to the state of an object to be subject to control, or the like. Also, the regions divided as shown in FIG. 3 may partially or wholly overlap with one another.

Although one embodiment of the present invention has been described, it should be understood that this embodiment is illustrative only and is not intended to limit the scope of the invention, this novel embodiment is capable of being practiced in other various forms, and various changes, substitutions, and alterations could be made hereto without departing from the basic concept of the invention. It is intended that the embodiment and modifications thereof be included within the scope and basic concept of the invention, and be included within the scope of the invention as defined in the appended claims and equivalence thereof.

What is claimed is:

1. An air conditioning system for a server room, comprising:
    means for adjusting an amount of admission of return air flowing out of the server room as an object to be subject to air conditioning control;
    means for adjusting an amount of admission of outside air;
    an air conditioning control setting unit configured to make air conditioning control settings for generating supply air in a state which lies within a target state and falls under a preset first specific enthalpy in order to generate the supply air in the target state from at least any one of the admitted return air and outside air, the target state being a state failing within a preset target range of supply air temperature, within a preset target range of supply air absolute humidity, and within a preset target range of supply air relative humidity; and configured to make air conditioning control settings for generating supply air in a state of a point of intersection of a line connecting a position indicating a state of the outside air and a position indicating a state of the return air, and a line indicating an upper limit value of the preset target range of supply air relative humidity in the target state, on a psychrometric chart when absolute humidity of the outside air is equal to or lower than an upper limit value of the preset target range of supply air absolute humidity, relative humidity of the outside air is higher than the upper limit value of the preset target range of supply air relative humidity, specific enthalpy of the outside air is equal to or higher than the preset first specific enthalpy, and specific enthalpy of the return air is equal to or higher than the preset first specific enthalpy, or when relative humidity of supply air obtained by mixing together the outside air and the return air is higher than the upper limit value of the preset target range of supply air relative humidity; and
    an equipment controller configured to generate control signals for controlling the amount of admission of the outside air and the amount of admission of the return air, based on the air conditioning control settings made by the air conditioning control setting unit, thereby controlling the means for adjusting the amount of admission of the return air and the means for adjusting the amount of admission of the outside air.

2. An air conditioning control method for a server room, comprising:

admitting at least any one of outside air and return air flowing out of the server room, making air conditioning control settings for generating supply air in a state which lies within a target state and falls under a preset first specific enthalpy, in order to generate the supply air in the target state, the target state being a state which falls within a preset target range of supply air temperature, within a preset target range of supply air absolute humidity, and within a preset target range of supply air relative humidity;

making air conditioning control settings for generating supply air in a state of a point of intersection of a line connecting a position indicating a state of the outside air and a position indicating a state of the return air, and a line indicating an upper limit value of the preset target range of supply air relative humidity in the target state, on a psychrometric chart when absolute humidity of the outside air is equal to or lower than an upper limit value of the preset target range of supply air absolute humidity, relative humidity of the outside air is higher than the upper limit value of the preset target range of supply air relative humidity, specific enthalpy of the outside air is equal to or higher than the preset first specific enthalpy, and specific enthalpy of the return air is equal to or higher than the preset first specific enthalpy, or when relative humidity of supply air obtained by mixing together the outside air and the return air is higher than the upper limit value of the preset target range of supply air relative humidity; and controlling air conditioning equipment configured to generate control signals for controlling the amount of outside air admission and the amount of return air admission, based on the air conditioning control settings made, thereby controlling air conditioning in the server room in.

* * * * *